United States Patent
Lo et al.

(10) Patent No.: US 8,853,564 B2
(45) Date of Patent: Oct. 7, 2014

(54) AIR CAVITY PACKAGE CONFIGURED TO ELECTRICALLY COUPLE TO A PRINTED CIRCUIT BOARD AND METHOD OF PROVIDING SAME

(75) Inventors: Chi Kwong Lo, Tsing Yi (CN); Lik Hang Wan, Fanling (HK); Ming Wa Tam, Sham Tseng (CN)

(73) Assignee: Ubotic Intellectual Property Co. Ltd., Hong Kong (HK)

( * ) Notice: Subject to any disclaimer, the term of this patent is extended or adjusted under 35 U.S.C. 154(b) by 0 days.

(21) Appl. No.: 13/640,724

(22) PCT Filed: Apr. 30, 2010

(86) PCT No.: PCT/CN2010/072367
§ 371 (c)(1),
(2), (4) Date: Oct. 11, 2012

(87) PCT Pub. No.: WO2011/134167
PCT Pub. Date: Nov. 3, 2011

(65) Prior Publication Data
US 2013/0128487 A1     May 23, 2013

(51) Int. Cl.
*H01L 23/48*  (2006.01)
(52) U.S. Cl.
USPC ............ 174/551; 257/696; 257/704; 257/724
(58) Field of Classification Search
CPC .................................................. H01L 23/49555
USPC ............................ 174/551; 257/696, 704, 724
See application file for complete search history.

(56) References Cited

U.S. PATENT DOCUMENTS

| | | | |
|---|---|---|---|
| 7,419,853 B2 | 9/2008 | Kuhmann et al. | |
| 7,692,288 B2* | 4/2010 | Zhe et al. | 257/704 |

(Continued)

FOREIGN PATENT DOCUMENTS

| | | |
|---|---|---|
| CN | 1215919 | 5/1999 |
| CN | 1813490 | 8/2006 |

(Continued)

OTHER PUBLICATIONS

International Search Report and Written Opinion for PCT Application No. PCT/CN2010/070775, 14 pages, Dec. 10, 2010.

(Continued)

*Primary Examiner* — Hung Ngo
(74) *Attorney, Agent, or Firm* — Bryan Cave LLP

(57) ABSTRACT

In some examples, a semiconductor package can be configured to electrically couple to a printed circuit board. The semiconductor package can include: (a) a lid having one or more first electrically conductive leads; (b) a base having a top, a bottom and one or more sides between the top and the bottom, the base having one or more second electrically conductive leads electrically coupled to the one or more first electrically conductive leads; (c) one or more first semiconductor devices mechanically coupled to the lid and electrically coupled to the one or more first electrically conductive leads; and (d) one or more first micro-electrical-mechanical system devices mechanically coupled to the lid and electrically coupled to the one or more first electrically conductive leads. The lid can be coupled to the base and at least one of the lid or the base has at least one port hole. The one or more second electrically conductive leads can be configured to couple to the printed circuit board at a first side of the one or more sides of the base. Other embodiments are disclosed.

24 Claims, 19 Drawing Sheets

(56) References Cited

U.S. PATENT DOCUMENTS

| | | | |
|---|---|---|---|
| 8,542,850 B2* | 9/2013 | Wang et al. | 381/175 |
| 2006/0081994 A1 | 4/2006 | Craig et al. | |
| 2008/0157301 A1 | 7/2008 | Ramakrishna et al. | |
| 2008/0166000 A1 | 7/2008 | Hsiao | |
| 2008/0298621 A1 | 12/2008 | Theuss et al. | |
| 2009/0001553 A1* | 1/2009 | Pahl et al. | 257/704 |
| 2009/0002961 A1* | 1/2009 | Camacho et al. | 361/760 |
| 2009/0057885 A1* | 3/2009 | Theuss | 257/723 |
| 2010/0078804 A1* | 4/2010 | Grusby | 257/698 |
| 2010/0127376 A1* | 5/2010 | Karim et al. | 257/690 |
| 2010/0176467 A1* | 7/2010 | Fukasawa et al. | 257/416 |
| 2010/0272302 A1* | 10/2010 | Feiertag et al. | 381/361 |
| 2011/0062573 A1* | 3/2011 | Zhe et al. | 257/680 |
| 2011/0127623 A1* | 6/2011 | Fueldner et al. | 257/416 |
| 2013/0128487 A1 | 5/2013 | Lo et al. | |

FOREIGN PATENT DOCUMENTS

| | | |
|---|---|---|
| CN | 2812465 | 8/2006 |
| CN | 2870352 | 2/2007 |
| CN | 101282594 | 10/2008 |
| CN | 101296530 | 10/2008 |
| CN | 101394687 | 3/2009 |
| CN | 101415138 | 4/2009 |
| CN | 101492148 | 7/2009 |
| CN | 201426177 | 3/2010 |
| JP | 2007178133 | 7/2007 |

OTHER PUBLICATIONS

International Search Report and Written Opinion for PCT Application No. PCT/CN2010/072363, 12 pages, Feb. 10, 2011.
International Search Report and Written Opinion for PCT Application No. PCT/CN2010/072367, 9 pages. Feb. 10, 2011.

* cited by examiner

AIR CAVITY PACKAGE CONFIGURED TO ELECTRICALLY COUPLE TO A PRINTED CIRCUIT BOARD AND METHOD OF PROVIDING SAME

CROSS-REFERENCE TO RELATED APPLICATIONS

This application is a national stage application under 35 U.S.C. 371 of and claims priority to International Application No. PCT/CN10/072367 filed Apr. 30, 2010. International Application No. PCT/CN10/072367 is incorporated herein by reference.

FIELD OF THE INVENTION

This invention relates generally to semiconductor packaging, and relates more particularly to packaging for micro-electro-mechanical system (MEMS) devices and methods of manufacturing the same.

DESCRIPTION OF THE BACKGROUND

Semiconductor devices are conventionally enclosed in plastic or ceramic packages that provide protection from hostile environments and enable electrical connections between elements of the integrated circuit.

Certain semiconductor devices, however, present unique packaging needs, such as air cavity packages that need sound or air to enter the semiconductor package for the enclosed semiconductor device to function properly. One example of a semiconductor device using an air cavity package is a micro-electro-mechanical system (MEMS) microphone. Other MEMS devices also can use similar air cavity packages.

Recently, the demand for MEMS microphones has increased because of the increased demand for cellular telephones and the incorporation of MEMS microphones in more portable audio devices and digital camera and video products.

Accordingly, a need or potential for benefit exists for an improved semiconductor or air cavity package for MEMS devices.

BRIEF DESCRIPTION OF THE DRAWINGS

To facilitate further description of the embodiments, the following drawings are provided in which.

Figure 1:
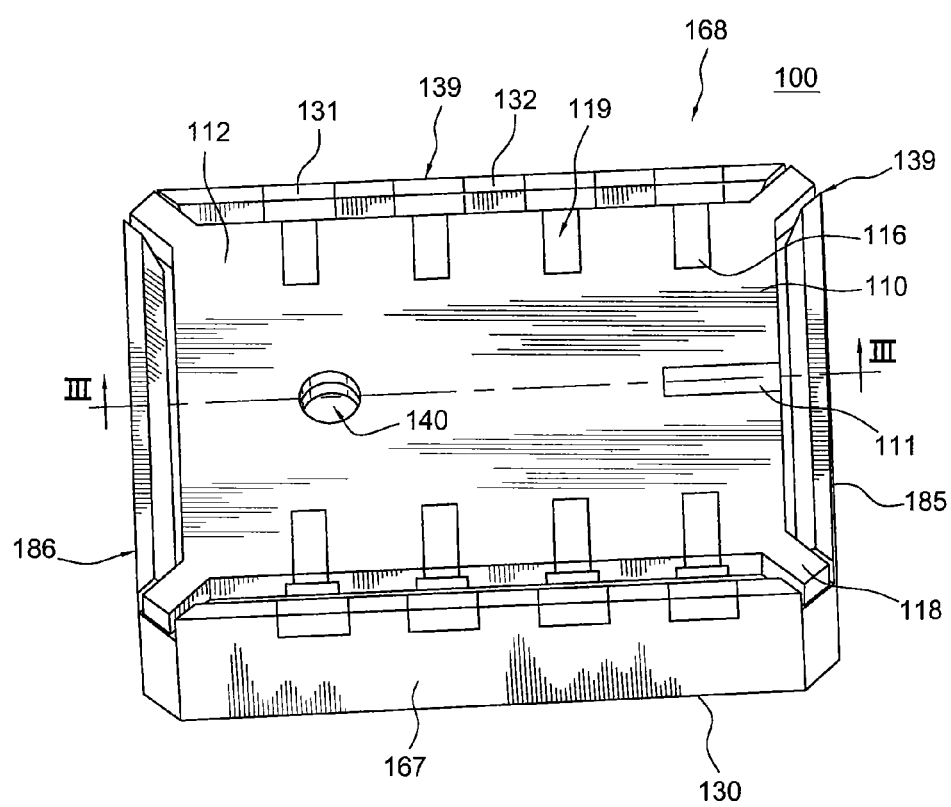
FIG. 1 illustrates a top, front isometric view of an example of a semiconductor package, according to a first embodiment.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Furthermore, the terms "include," and "have," and any variations thereof, are intended to cover a non-exclusive inclusion, such that a process, method, system, article, device, or apparatus that comprises a list of elements is not necessarily limited to those elements, but may include other elements not expressly listed or inherent to such process, method, system, article, device, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein.

The terms "couple," "coupled," "couples," "coupling," and the like should be broadly understood and refer to connecting two or more elements or signals, electrically, mechanically and/or otherwise. Two or more electrical elements may be electrically coupled but not be mechanically or otherwise coupled; two or more mechanical elements may be mechanically coupled, but not be electrically or otherwise coupled; two or more electrical elements may be mechanically coupled, but not be electrically or otherwise coupled. Coupling may be for any length of time, e.g., permanent or semi-permanent or only for an instant.

"Electrical coupling" and the like should be broadly understood and include coupling involving any electrical signal, whether a power signal, a data signal, and/or other types or combinations of electrical signals. "Mechanical coupling" and the like should be broadly understood and include mechanical coupling of all types. The absence of the word "removably," "removable," and the like near the word "coupled," and the like does not mean that the coupling, etc. in question is or is not removable.

DETAILED DESCRIPTION OF EXAMPLES OF EMBODIMENTS

In some examples, a semiconductor package can be configured to electrically couple to a printed circuit board. The semiconductor package can include: (a) a lid having one or more first electrically conductive leads; (b) a base having a top, a bottom and one or more sides between the top and the bottom, the base having one or more second electrically conductive leads electrically coupled to the one or more first electrically conductive leads; (c) one or more first semiconductor devices mechanically coupled to the lid and electrically coupled to the one or more first electrically conductive leads; and (d) one or more first micro-electrical-mechanical system devices mechanically coupled to the lid and electrically coupled to the one or more first electrically conductive leads. The lid can be coupled to the base and at least one of the lid or the base has at least one port hole. The one or more second electrically conductive leads can be configured to couple to the printed circuit board at a first side of the one or more sides of the base.

In other examples, an air cavity package can be configured to couple to a printed circuit board. The air cavity package can include: (a) a lid having: (1) a first leadframe; and (2) a first non-electrically conductive material coupled to the first leadframe; (b) a base mechanically coupled to the lid, the base having a bottom and a first side substantially perpendicular to the bottom, the base having: (1) a second leadframe electrically coupled to the first leadframe; and (2) a second non-electrically conductive material coupled to the second leadframe; (c) at least one first electrical device mechanically coupled to the lid and electrically coupled to the first leadframe; and (d) at least one second electrical device mechanically coupled to the base and electrically coupled to the second leadframe. The at least one first electrical device can have at least one of a first micro-electro-mechanical system device or a first semiconductor device. The at least one second electrical device can have at least one of a second micro-electro-mechanical system device or a second semiconductor device. At least one of the lid or the base can have at least one first aperture. The at least one first aperture can provide a passageway from an interior of the air cavity package to an exterior of the air cavity package. The base can be configured to be mechanically coupled to the printed circuit board at the first side. The second leadframe can be configured to be electrically coupled to the printed circuit board at the first side.

In yet further examples, a method of providing a semiconductor package can include: providing a first leadframe; providing a first non-electrically conductive material around the first leadframe to form a lid; providing at least one micro-electrical-mechanical system device and at least one electrical component; coupling the at least one micro-electrical-mechanical system device and the at least one electrical component to the lid; electrically coupling the at least one micro-electrical-mechanical system device, the at least one electrical component, and the first leadframe; providing a second leadframe; providing a second non-electrically conductive material around the second leadframe to form a base, the base having a top, a bottom, and one or more sides between the top and the bottom; coupling the lid to the base; and coupling the base of the semiconductor package to a printed circuit board such that the second leadframe is electrically coupled to the printed circuit board at a first side of the one or more sides of the base.

Figure 2:
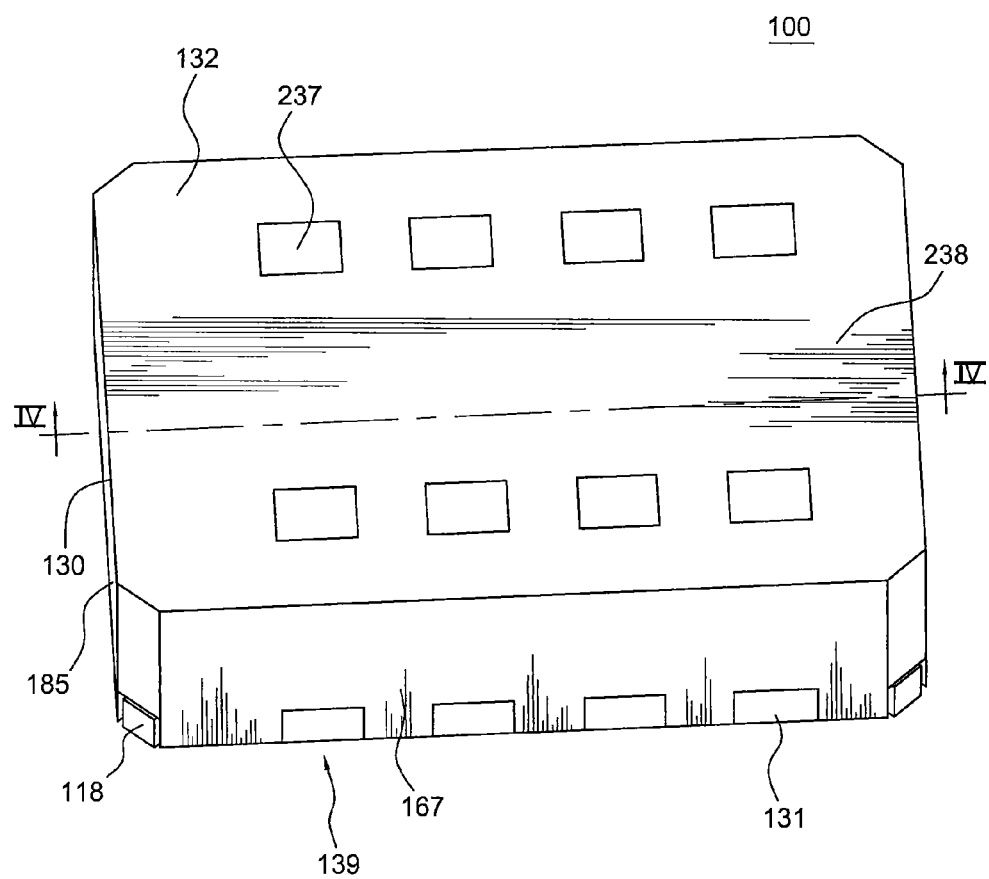
FIG. 2 illustrates a bottom, back isometric view of the semiconductor package of FIG. 1, according to the first embodiment.
Figure 3:
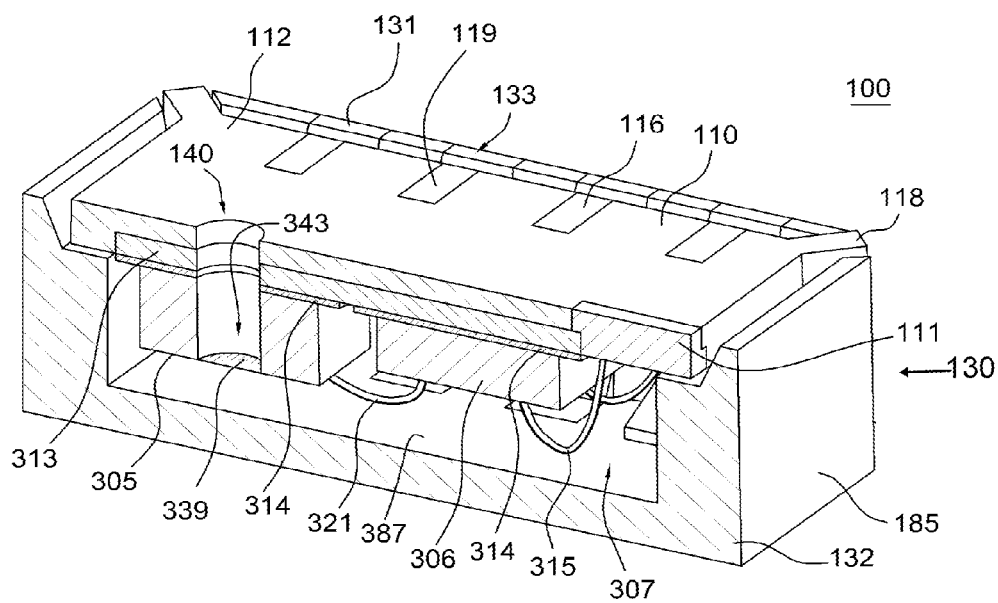
FIG. 3 illustrates a cross-sectional view of the semiconductor device of FIG. 1 along the III-III line (FIG. 1), according to the first embodiment.
Figure 4:
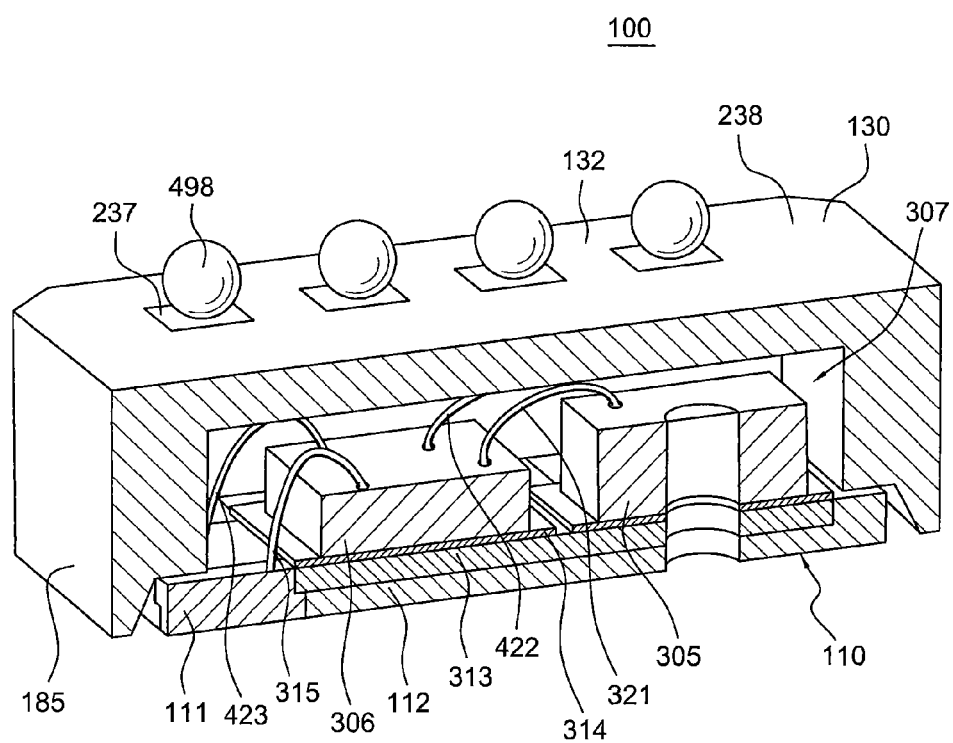
FIG. 4 illustrates a upside down cross-sectional view of the semiconductor device of FIG. 1 along the IV-IV line (FIG. 2) with additional solder balls, according to the first embodiment.
Figure 5:
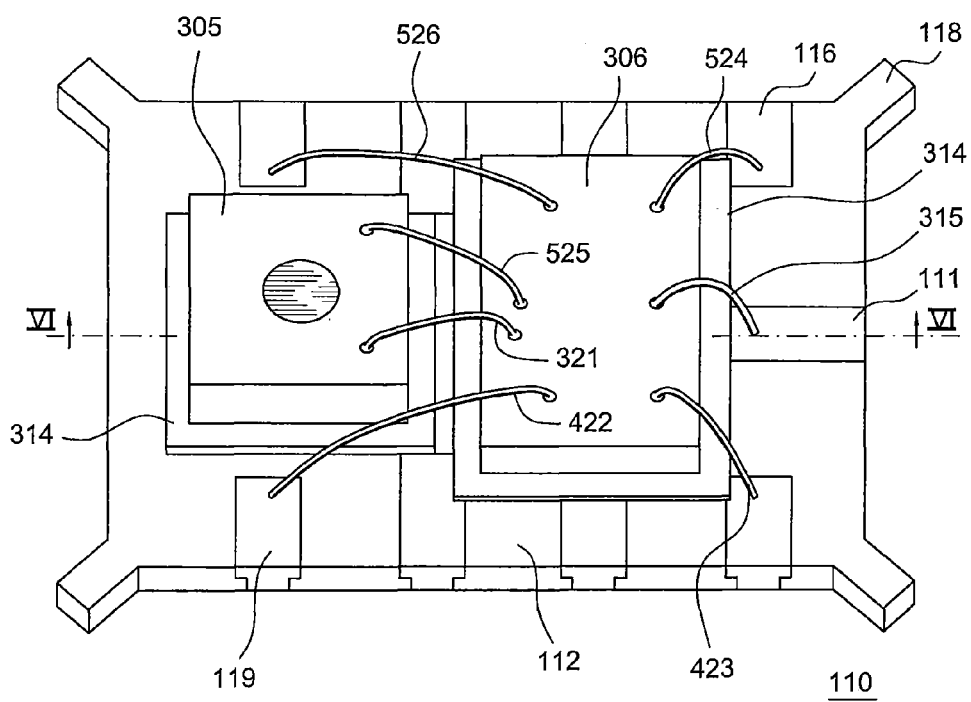
FIG. 5 illustrates a top, front isometric view of an example of a lid of the semiconductor package of FIG. 1, according to the first embodiment.
Figure 6:
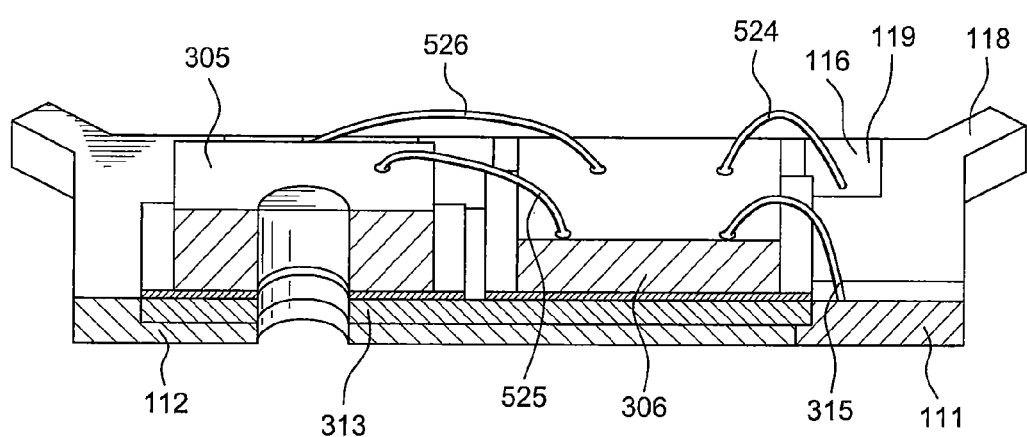
FIG. 6 illustrates a cross-sectional view of the lid of FIG. 5 along the VI-VI line (FIG. 5), according to the first embodiment.
Figure 7:
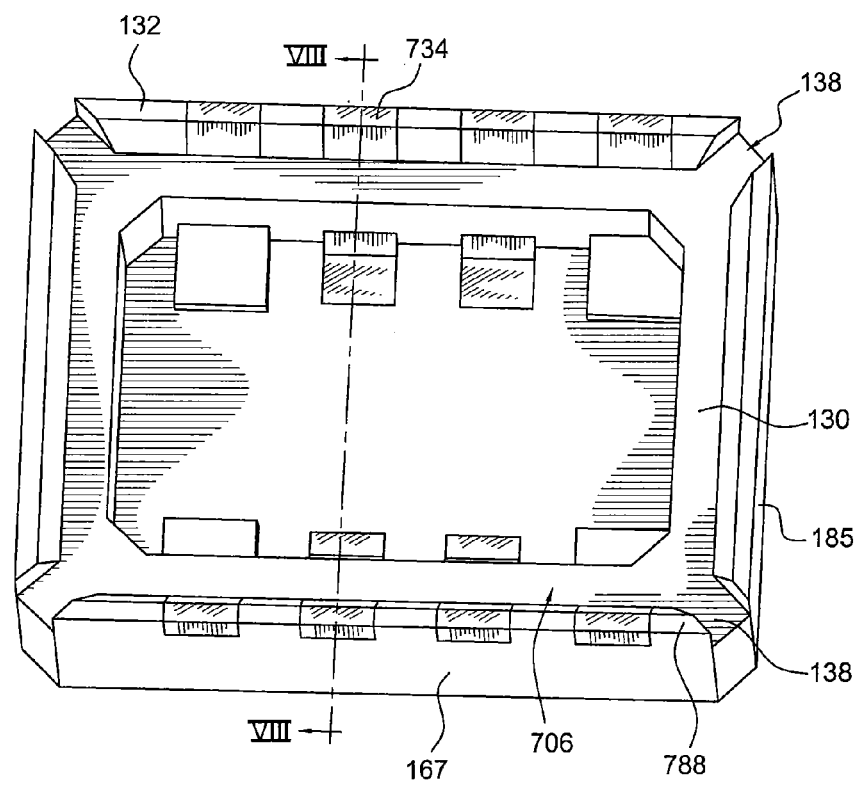
FIG. 7 illustrates a top, front isometric view of an example of a base of the semiconductor package of FIG. 1, according to the first embodiment.
Figure 8:
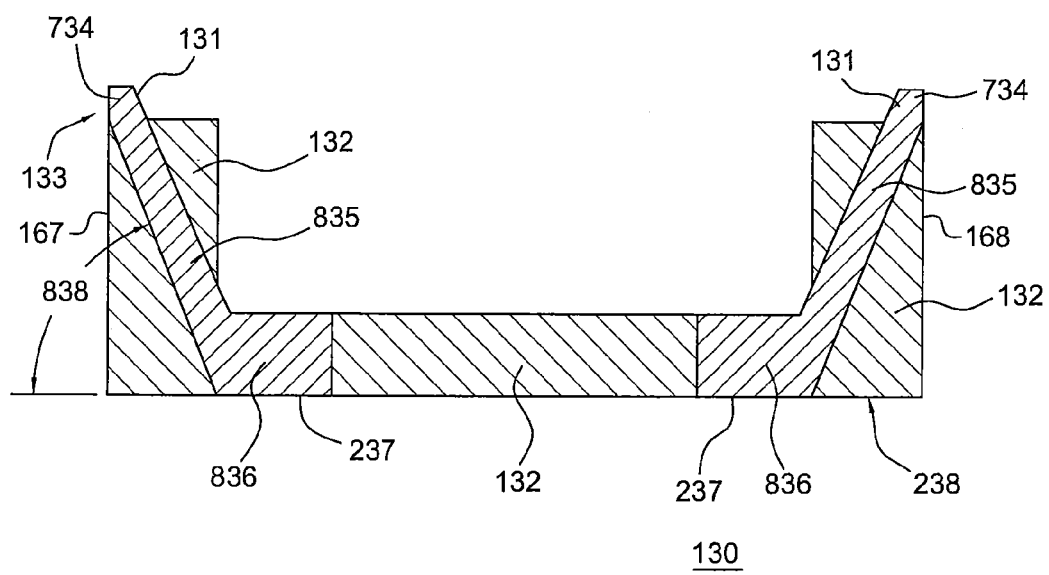
FIG. 8 illustrates a cross-sectional view of the base of FIG. 7 along the VIII-VIII line (FIG. 7), according to the first embodiment.

Turning to the drawings, FIG. 1 illustrates a top, front isometric view of an example of a semiconductor package 100, according to a first embodiment. FIG. 2 illustrates a bottom, back isometric view of semiconductor package 100, according to the first embodiment. FIG. 3 illustrates a cross-sectional view of semiconductor package 100 along the III-III line (FIG. 1), according to the first embodiment. FIG. 4 illustrates an upside down cross-sectional view of semiconductor package 100 along the IV-IV line (FIG. 2) with solder balls 498, according to the first embodiment. FIG. 5 illustrates a top, front isometric view of an example of a lid 110, according to the first embodiment. FIG. 6 illustrates a cross-sectional view of lid 110 along the VI-VI line (FIG. 5), according to the first embodiment. FIG. 7 illustrates a top, front isometric view of an example of a base 130, according to the first embodiment. FIG. 8 illustrates a cross-sectional view of base 130 along the VIII-VIII line (FIG. 7), according to the first embodiment. Semiconductor package 100 is merely exemplary and is not limited to the embodiments presented herein. Semiconductor package 100 can be employed in many different embodiments or examples not specifically depicted or described herein.

Figure 10:
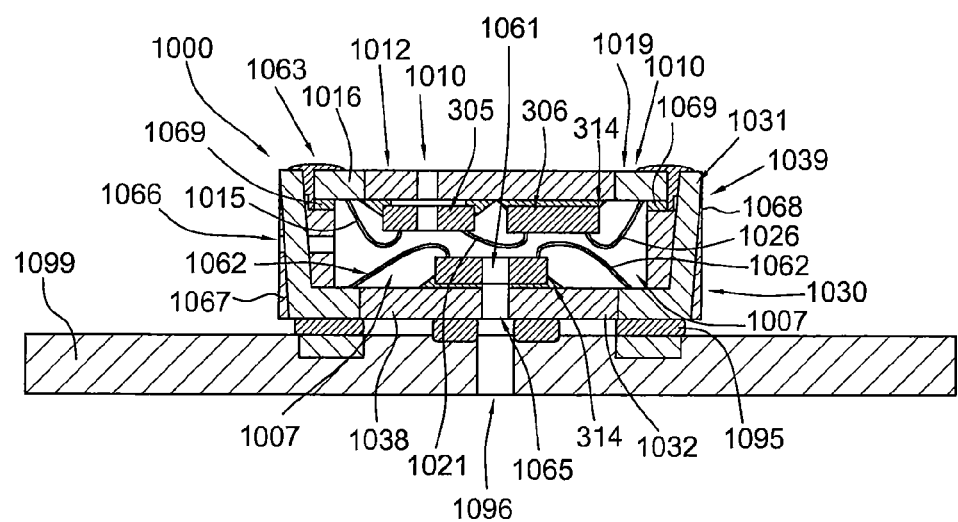
FIG. 10 illustrates a cross-sectional view of a semiconductor package with a top of a base of the semiconductor package coupled to a printed circuit board, according to a third embodiment.

In some embodiments, an air cavity package or semiconductor package 100 can be configured to electrically couple to a printed circuit board (PCB), for example, PCB 1099 (FIG. 10). Semiconductor package 100 can include: (a) a lid 110; (b) a base 130; (c) at least one micro-electro-mechanical system (MEMS) device 305 (FIG. 3); (d) at least one electrical component 306 (FIG. 3); and (e) wires 315, 321, 422, 423, 524, 525, and 526 (FIGS. 3-5).

Lid 110 can be coupled to base 130 such that an interior cavity 307 (FIG. 3) exists between lid 110 and base 130. MEMS device 305 and electrical component 306 can be located in interior cavity 307. Interior cavity 307 can have enough back volume between MEMS device 305 and base 130 to reflect sound waves in interior cavity 307 to provide a capacitance in MEMS device 305 change allowing the detection of frequency change based on the sound waves in semiconductor package 100. In some examples, the back volume of interior cavity 307 depends on the specific MEMS device used and the desired sensitivity of the MEMS device.

In other examples, semiconductor package 100 can include two or more MEMS devices and only one electrical component. In yet other examples, semiconductor package 100 can include two or more electrical components and only one MEMS device. In further examples, semiconductor package 100 can include two or more MEMS devices and two or more electrical components. In still other embodiments, semiconductor package 100 does not include any electrical components and includes only one or more MEMS devices.

In some examples, MEMS device 305 (FIG. 3) can be a MEMS microphone, which is commonly found in cellular telephones and other audio-related applications. In other examples, MEMS device 305 can include other types of semiconductor sensors such as altimeters, chemical sensors, or light sensors. MEMS device 305 can be coupled to leadframe 119 using wires 422 and 526

Electrical component 306 (FIG. 3) can be an application specific integrated circuit (ASIC). In other examples, electrical component 306 can be a passive device (e.g., a capacitor, a resistor, or inductor) or single active device (e.g., a power transistor). In still further embodiments, electrical component 306 can be one or more ASICs and one or more passive devices. In some examples, wires 321 and 525 can electrically couple electrical component 306 to MEMS device 305. Electrical component 306 can be electrically coupled to a leadframe 119 using wires 315, 423, and 524.

Lid 110 can include: (a) a leadframe 119 with one or more electrically conductive leads 111 and 116; (b) non-electrically conductive material 112; (c) at least one die pad 313; and (d) die attach material 314. MEMS device 305 and electrical component 306 can be located over die pad 313 and die attach material 314. Die attach material 314 can couple die pad 313 to MEMS device 305 and/or electrical component 306. That is, MEMS device 305 and electrical component 306 can be mechanically coupled to die pad 313 and electrically coupled to electrically conductive leads 111 and/or 116 through die pad 313.

In many examples, lid 110 also has an aperture 140, which interconnects the exterior of semiconductor package 100 and interior cavity 307. In some examples, MEMS device 305 is at least partially located over or under aperture 140. MEMS device 305 can have an opening 343, which creates a passageway from aperture 140 into interior cavity 307. In some examples, aperture 140 and opening 343 can each have a diameter in the range of approximately 0.35 millimeters (mm) to approximately 1.0 mm (e.g., 0.50 mm). In other examples, aperture 140 and opening 343 can have different sizes. In the same or different examples, MEMS device 305 can have a membrane 339 in opening 343. In the illustrated example, membrane 339 is located at the side of MEMS device 305 opposite the coupling of MEMS device 305 and aperture 140. In other examples, semiconductor package 100 can have additional apertures or apertures located at other portions of lid 110 or base 130.

In some embodiments, non-electrically conductive material 112 can include LCP (liquid crystal polymer) plastic, PEEK (polyetheretherketone) plastic, ABS (acrylonitrile butadiene styrene) plastic, PCV (polyvinyl chloride) plastic, PCB (polychlorinated biphenyl) plastic, an epoxy resin, BT (bismaleimide triazine resin) laminate, an organic laminate, or the equivalent. In some examples, LCP is preferred over other materials because of its highest material stiffness, better dimensional stability with low shrinkage (especially at high temperatures), and better mold flow in thin sections (e.g., thin wall capability).

Base 130 can include: (a) a leadframe 139 with one or more electrically conductive leads 131 electrically coupled to electrically conductive leads 111 and/or 116; and (b) non-electrically conductive material 132. Non-electrically conductive material 132 can be located around electrically conductive leads 131. In some examples, non-electrically conductive material 132 can be comprised of the same or similar material used in non-electrically conductive material 112. In one example, base 130 can have a length of approximately 4,000 mm and a width of approximately 3,000 mm. In some examples, base 130 can have: (a) a top 387, 706, and/or 788 (FIGS. 3 and 7); (b) a bottom 238 (FIG. 2); and (c) one or more sides 167, 168, 185, and 186.

Electrically conductive leads 131 can be are configured to couple to a PCB. In some examples, as illustrated in FIG. 8, each of electrically conductive leads 131 can include: (a) a lid coupling portion 734 configured to couple to one of electrically conductive leads 116; (b) a downset portion 835 coupled to lid coupling portion 734; and (c) a pad portion 836 with mounting pads 237 and coupled to downset portion 835 and configured to electrically couple to a printed circuit board.

Mounting pads 237 (e.g., outer-connected lands or surface mount pads) can be used to couple semiconductor package 100 to a PCB (not shown) by, for example, surface mount adhesive techniques (SMT), solder balls, or flip chip techniques. For example, FIG. 4 shows mounting pads 237 coupled to solder balls 498.

In the embodiment shown in FIGS. 2, 4, and 8, mounting pads 237 are planar with a bottom surface of non-electrically conductive material 132 (i.e., bottom surface 238 can be a planar bottom surface). In other examples, non-electrically conductive material 132 and mounting pads 237 do not form a planar bottom surface of base 130. For example, the non-electrically conductive material can extend beyond the mounting pads by a predetermined distance (e.g., approximately 100 micrometers) with openings in the non-electrically conductive material to provide access to the mounting pads. In some examples, the openings can have a diameter of approximately 300 mm.

In various examples, downset portion 835 is at an angle 838 with exterior surface 238 of base 130. In some embodiments, angle 838 is between approximately twenty degrees and approximately ninety degrees. For example, angle 838 can be approximately thirty degrees. In other examples, downset portion 835 can be substantially perpendicular to lid 110 and pad portion 836. In some examples, pad portion 836 can be substantially parallel to lid 110.

Electrically conductive leads 131 of base 130 can be electrically coupled to electrically conductive leads 116 of lid 110. In some examples, an electrically conductive paste or solder (not shown) can be used to couple electrically conductive leads 116 to electrically conductive leads 131. In some examples, electrically conductive leads 111 and 116 can be used for interconnection between: (a) electrical component 306 and/or MEMS device 305; and (b) the printed circuit board.

In various embodiments, lid 110 can be flipped on top of base 130 and connected via a bonding process. Lid 110 and base 130 can be coupled using non-electrically conductive adhesive and/or conductive adhesive to provide the electrical interconnects need by MEMS device 305 and electrical component 306 to function properly.

Additionally, in some embodiments, base 130 can include one or more grooves 138. Lid 110 can have one or more protrusions 118 that are complementary to grooves 138. In one examples, protrusions 118 can be rectangular projections (e.g., t-bars) extending from the corners of lid 110. Protrusions 118 of lid 110 can be configured to couple to grooves 138 in base 130. In the same or different example, base 130 can have a shelf or top 706 (FIG. 7) on which lid 110 can rest and/or be mechanically coupled. Placing protrusions 118 in grooves 138 can align lid 110 and base 130. In some examples, protrusions 118 and grooves 138 can be help make lid 110 and base 130 self-aligning. In the same or different examples, protrusions 118 can be mechanically coupled to grooves 139 using a non-electrically conductive adhesive. In other embodiments, base 130 can have protrusions, and lid 110 can have grooves.

Semiconductor package 100 includes configurable electrical connections. That is, semiconductor package 100 is configured such that lid 110 or base 130 can be electrically coupled to a PCB at several different locations (i.e., the top, the bottom, or at least one of the sides). For examples, lid 110 can be mounted on a PCB (see, e.g., FIG. 11), and electrical leads 116 and 111 can be coupled to the PCB. In other examples, semiconductor package 100 can be side mounted on a PCB (see, e.g., FIGS. 12, 14, and 16), and electrically conductive leads 131 can be coupled at lid coupling portion 734 to the PCB. In some embodiments, base 130 can be mechanically coupled to the PCB at side 167 or 168, and electrically conductive leads 131 can be coupled to the PCB at side 167 or 168. In still other examples, the bottom of base 130 can be mounted on a PCB (see, e.g., FIGS. 10 and 13), and mounting pads 237 can be electrically coupled to the PCB.

In some examples, one of more of the surfaces semiconductor package 100 can be coated with an electrically conductive surface coating. The conductive surface coating can provide shielding for MEMS device 305 or electrical component 306. For example, an interior surface of base 130 can have a metalized coating (e.g., gold) to act as a radio frequency shield for the MEMS device. In some examples, the coating can be applied using plating or sputtering process.

Figure 9:
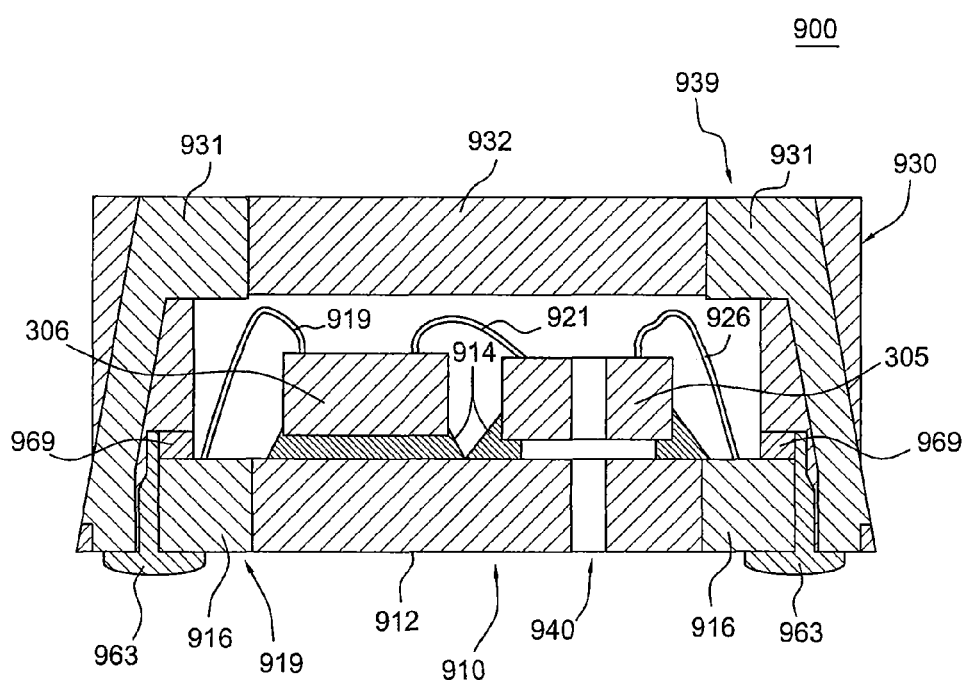
FIG. 9 illustrates a cross-sectional view of a semiconductor package, according to a second embodiment.

FIG. 9 illustrates a cross-sectional view of a semiconductor package 900, according to a second embodiment. Semiconductor package 900 is merely exemplary and is not limited to the embodiments presented herein. Semiconductor package 900 can be employed in many different embodiments or examples not specifically depicted or described herein.

In some embodiments, an air cavity package or semiconductor package 900 can include: (a) a lid 910; (b) a base 930; (c) at least one MEMS device 305; (d) at least one electrical component 306; (e) wires 915, 921, and 926; (f) non-electrically conductive adhesive 969 mechanically coupling lid 910 to base 930; and (g) electrically conductive solder 963 electrically and mechanically coupling lid 910 to base 930. Electrically conductive solder 963 can be also used to couple semiconductor package 900 to a PCB.

Semiconductor package 900 includes configurable electrical connections. That is, semiconductor package 900 is configured such that lid 910 or base 930 can be electrically coupled to a PCB at several different locations (i.e., the top, the bottom, or at least one of the sides).

Electrical component 306 is electrically coupled to leadframe 919 using wire(s) 915. MEMS device 305 is electrically coupled to leadframe 919 using wire(s) 926. Electrical component 306 is electrically coupled to MEMS device 305 using wire(s) 921. In other examples, other combinations of wire bonding can be used. In a different embodiment, wire bonding is not used and can be replaced with solder balls, flip chip technologies, or the like.

In other examples, semiconductor package 900 can include two or more MEMS devices and only one electrical component. In further examples, semiconductor package 900 can include two or more MEMS devices and two or more electrical components. In still other embodiments, semiconductor package 900 does not include any electrical components and includes only one or more MEMS devices.

Lid 910 can include: (a) a leadframe 919 with one or more electrically conductive leads 916 electrically coupled to MEMS device 305 and electrical component 306; (b) non-electrically conductive material 912 with an aperture 940; and (c) adhesive 914. Adhesive 914 can couple non-electrically conductive material 912 to MEMS device 305 and/or electrical component 306. In some examples, MEMS device 305 and/or electrical component 306 can be coupled to lid 910 using at least one die pad (not shown).

Non-electrically conductive material 912 can be located around leadframe 919. In some examples, non-electrically conductive material 912 can be comprised of the same or similar to material used in non-electrically conductive material 112 (FIG. 1).

Base 930 can include: (a) a leadframe 939 with one or more electrically conductive leads 931 electrically coupled to electrically conductive leads 916; and (b) non-electrically conductive material 932. Non-electrically conductive material 932 can be located around electrically conductive leads 931. In some examples, non-electrically conductive material 932 can be comprised of the same or similar material used in non-electrically conductive material 112 (FIG. 1). In other examples, non-electrically conductive material 932 can have one or more apertures.

Figure 11:
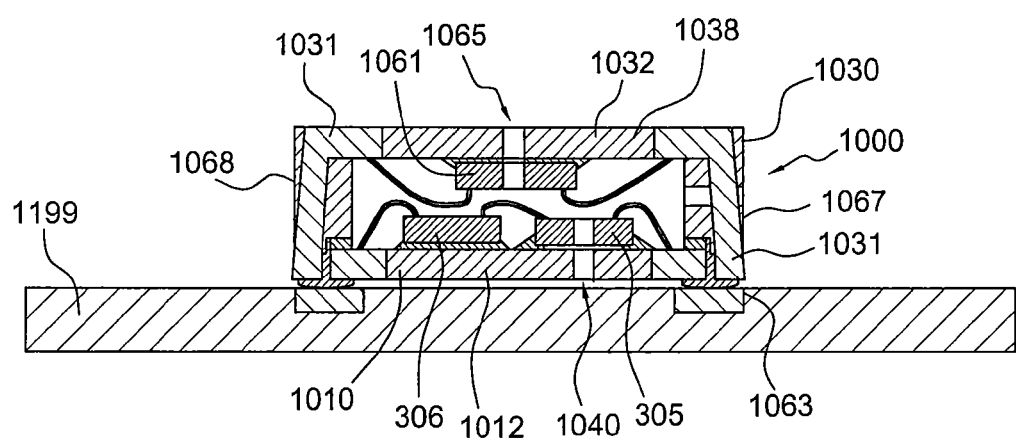
FIG. 11 illustrates a cross-sectional view of the semiconductor package of FIG. 10 with a lid of the semiconductor package of FIG. 10 coupled to a printed circuit board, according to the third embodiment.
Figure 12:
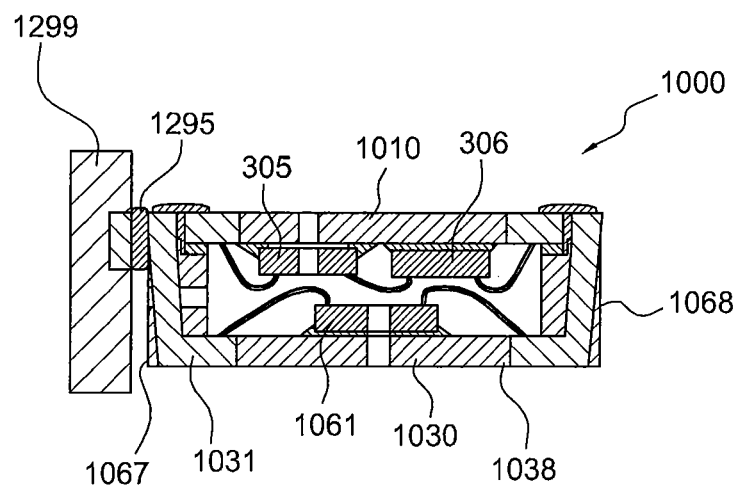
FIG. 12 illustrates a cross-sectional view of the semiconductor package of FIG. 10 with a side of the base of the semiconductor package of FIG. 10 coupled to a printed circuit board, according to the third embodiment.

FIG. 10 illustrates a cross-sectional view of a semiconductor package 1000 with bottom 1038 of base 1030 coupled to PCB 1099, according to a third embodiment. FIG. 11 illustrates a cross-sectional view of the semiconductor package 1000 with lid 1010 coupled to PCB 1199, according to the third embodiment. FIG. 12 illustrates a cross-sectional view of the semiconductor package 1000 with side 1067 of base 1030 coupled to PCB 1299, according to the third embodiment. Semiconductor package 1000 is merely exemplary and is not limited to the embodiments presented herein. Semiconductor package 1000 can be employed in many different embodiments or examples not specifically depicted or described herein.

In some embodiments, an air cavity package or semiconductor package 1000 can include: (a) a lid 1010; (b) a base 1030; (c) at least two MEMS device 305 and 1061; (d) at least one electrical component 306; (e) wires 1015, 1021, 1026, and 1062; (f) non-electrically conductive adhesive 1069 mechanically coupling lid 1010 to base 1030; and (g) electrically conductive solder 1063 electrically and mechanically coupling lid 1010 to base 1030. Electrically conductive solder 1063 can be also used to couple semiconductor package 1000 to a PCB 1199, as illustrated in FIG. 11.

In other examples, semiconductor package 1000 can include two or more electrical components and only one MEMS device. In further examples, semiconductor package 1000 can include two or more MEMS devices and two or more electrical components. In still other embodiments, semiconductor package 1000 does not include any electrical components, and includes only one or more MEMS devices.

Lid 1010 can include: (a) a leadframe 1019 with one or more electrically conductive leads 1016 electrically coupled to MEMS device 305 and electrical component 306; (b) non-electrically conductive material 1012; and (c) die attach material 314. Die attach material 314 can couple lid 1010 to MEMS device 305 and electrical component 306. In some examples, MEMS device 305 and/or electrical component 306 can be coupled to lid 1010 using a die pad (not shown).

Non-electrically conductive material 1012 can be located around electrically conductive leads 1016. In some examples, non-electrically conductive material 1012 can be comprised of the same or similar to material used in non-electrically conductive material 112 (FIG. 1).

Base 1030 can include: (a) a leadframe 1039 with one or more electrically conductive leads 1031; and (b) non-electrically conductive material 1032. Non-electrically conductive material 1032 can be located around electrically conductive leads 1031. In some examples, non-electrically conductive material 1032 can be comprised of the same or similar material used in non-electrically conductive material 112 (FIG. 1).

Electrical component 306 is electrically coupled to leadframe 1019 using wire(s) 1026. MEMS device 305 is electrically coupled to leadframe 1019 using wire(s) 1015. Electrical component 306 is electrically coupled to MEMS device 305 using wire(s) 1021. MEMS device 1061 is electrically coupled to leadframe 1039 using wires 1062. In other examples, other combinations of wire bonding can be used. In a different embodiment, wire bonding is not used and is replaced with solder balls, flip chip technologies, or the like.

In some examples, semiconductor package 1000 can have apertures 1040, 1065, and 1066, which interconnect the exterior of semiconductor package 1000 and interior cavity 1007. In some examples, MEMS device 305 is at least partially located over or under aperture 1040. Aperture 1066 can be located on a side 1067 of base 1030. Aperture 1065 can be located at bottom 1039 of base 1030. In embodiments where base 1030 is coupled to PCB 1099, PCB can have an opening 1096 over or under aperture 1065. In other examples, semiconductor package 1000 can have additional apertures or apertures located other portions of lid 1010 or base 1030. For examples, aperture 1040, 1065, and/or 1066 could be located at side 1068.

Semiconductor package 1000 includes configurable electrical connections. That is, semiconductor package 1000 is configured such that lid 1010 or base 1030 can be electrically coupled to a PCB at several different locations (i.e., the top, the bottom, or at least one of the sides).

In the example shown in FIG. 10, base 1030 is electrically and mechanically coupled to PCB 1099 using solder balls 1095. In the example shown in FIG. 11, lid 1010 is electrically and mechanically coupled to PCB 1199 using solder balls 1195.

In the same or different examples, sides 1067 and 1068 are formed by electrically conductive leads 1031 and non-electrically conductive material 1032. In these examples, electrically conductive leads 1031 at side 1067 or 1068 can be coupled to a PCB by, for example, surface mount adhesive techniques (SMT), solder balls, or flip chip techniques. In the example shown in FIG. 12, side 1067 of base 1030 is electrically and mechanically coupled to PCB 1299 using one or more solder balls 1295.

Figure 13:
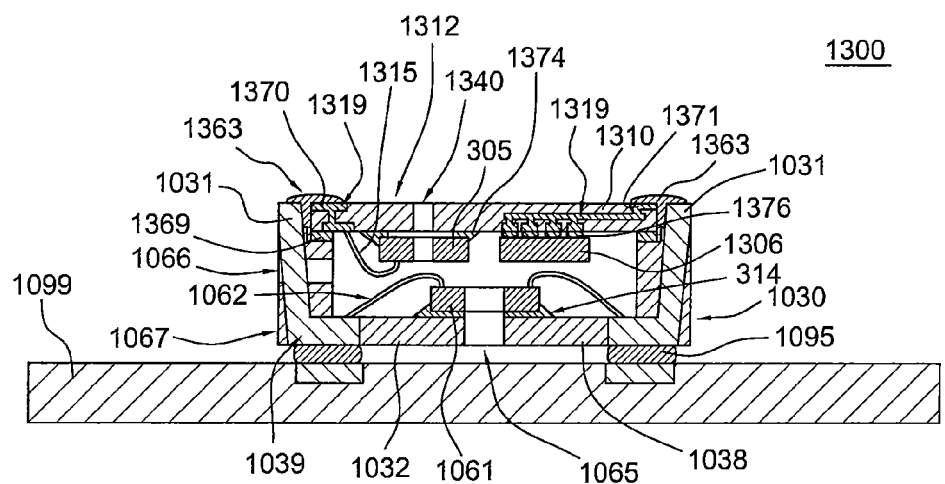
FIG. 13 illustrates a cross-sectional view of a semiconductor package coupled to a printed circuit board, according to a fourth embodiment.

Referring to another embodiment, FIG. 13 illustrates a cross-sectional view of a semiconductor package 1300, according to a fourth embodiment. Semiconductor package 1300 is merely exemplary and is not limited to the embodiments presented herein. Semiconductor package 1300 can be employed in many different embodiments or examples not specifically depicted or described herein.

In some embodiments, an air cavity packaging or semiconductor package 1300 can include: (a) a lid 1310; (b) a base 1030; (c) at least two MEMS device 305 and 1061; (d) at least one electrical component 1306; and (e) wires 1062 and 1315; (f) non-electrically conductive adhesive 1369 mechanically coupling lid 1310 to base 1030; and (g) electrically conductive solder 1363 electrically and mechanically coupling lid 1310 to base 1030. Electrically conductive solder 1363 can be also used to couple semiconductor package 1300 to a PCB.

Semiconductor package 1300 includes configurable electrical connections. That is, semiconductor package 1300 is configured such that lid 1310 or base 1030 can be electrically coupled to a PCB at several different locations (i.e., the top, the bottom, or at least one of the sides). In the example shown in FIG. 13, a bottom of base 1030 is electrically and mechanically coupled to PCB 1099.

In other examples, semiconductor package 1300 can include two or more electrical components and only one MEMS device. In further examples, semiconductor package 1300 can include two or more MEMS devices and two or more electrical components. In still other embodiments, semiconductor package 1300 does not include any electrical components, and includes only one or more MEMS devices.

Lid 1310 can include: (a) a leadframe 1319 with one or more electrically conductive leads 1370 and 1371; (b) non-electrically conductive material 1312; and (c) adhesive material 1374 and 1376. In one embodiment, lid 1310 can be similar to a single or multi layer PCB. In some examples, non-electrically conductive material 1312 can have at least one aperture 1340. Electrically conductive leads 1370 and 1371 can be electrically coupled to MEMS device 305 and electrical component 1306, respectively. MEMS device 305 can be electrically coupled to electrically conductive lead 1370 using wire 1315.

Adhesive material 1374 can mechanically couple non-electrically conductive material 1312 to MEMS device 305. Adhesive material 1376 can mechanically and electrically couple electrical component 1306 to electrically conductive lead 1370. In some examples, electrical component 1306 can be electrically coupled to electrically conductive lead 1371 using surface mount adhesive techniques (SMT), solder balls, or flip chip techniques. Electrically conductive leads 1370 and 1371 can be electrically and mechanically coupled to electrically conductive leads 1031 using an electrically conductive solder 1363.

In other examples, MEMS device 305 (and/or MEMS device 1061) can be electrically coupled to leadframe 1319 using surface mount adhesive techniques (SMT), solder balls, or flip chip techniques. In still other embodiments, each of MEMS device 305, electrical component 1306, and/or MEMS device 1061 can be electrically coupled to leadframe 1319 using surface mount adhesive techniques (SMT), solder balls, or flip chip techniques Non-electrically conductive material 1312 can be located around electrically conductive leads 1370 and 1371. In some examples, non-electrically conductive material 1312 can comprise an organic substrate or can be composed from materials similar to the material of non-electrically conductive material 112.

Figures 14, 15:
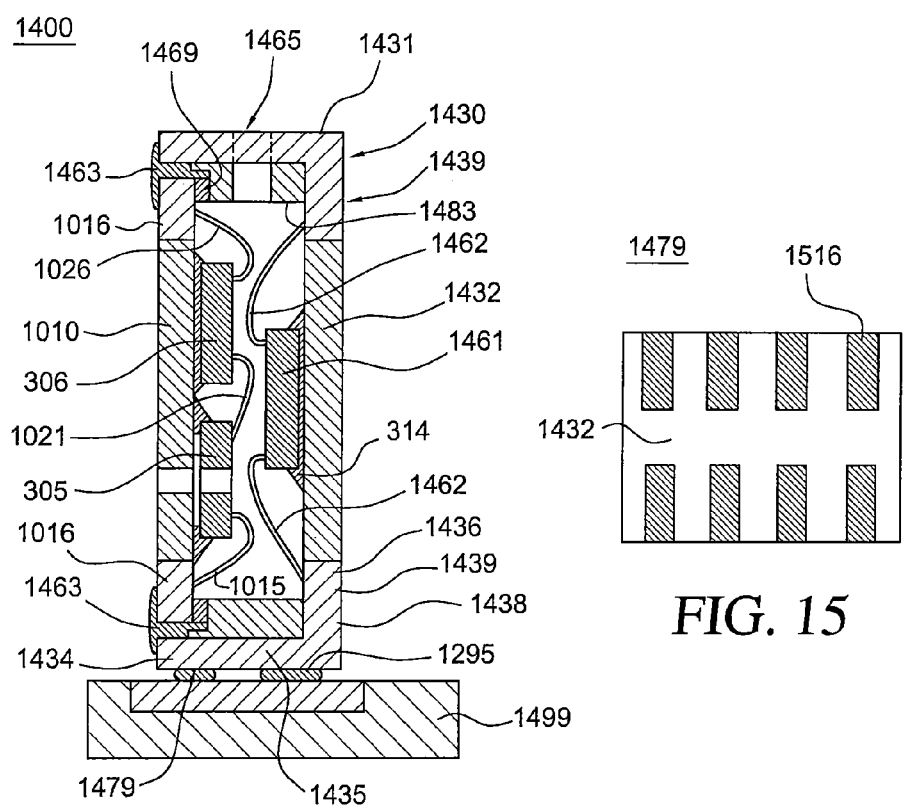
FIG. 14 illustrates a cross-sectional view of a semiconductor package coupled to a printed circuit board, according to a fifth embodiment.
FIG. 15 illustrates a bottom view of a side of the semiconductor package of FIG. 14 before being mounted to the printed circuit board, according to the fifth embodiment.

Referring to yet another embodiment, FIG. 14 illustrates a cross-sectional view of a semiconductor package 1400, according to a fifth embodiment. FIG. 15 illustrates a bottom view of side 1479 of semiconductor package 1400, according to the fifth embodiment. Semiconductor package 1400 is merely exemplary and is not limited to the embodiments presented herein. Semiconductor package 1400 can be employed in many different embodiments or examples not specifically depicted or described herein.

In some embodiments, an air cavity packaging or semiconductor package 1400 can include: (a) a lid 1010; (b) a base 1430; (c) at least one MEMS device 305; (d) at least one electrical component 306 and 1461; (e) wires 1016, 1021, 1026, 1462; (f) non-electrically conductive adhesive 1469 mechanically coupling lid 1010 to base 1430; and (g) electrically conductive solder 1463 electrically and mechanically coupling lid 1010 to base 1430. In some embodiments electrically conductive solder 1463 can be also used to couple semiconductor package 1400 to a PCB.

In the example illustrated in FIG. 14, semiconductor package 1400 is a vertically mounted package. That is, semiconductor package 1400 is coupled to PCB 1499 at side 1479 of base 1430. Semiconductor package 1400 can also be configured such that lid 1010 or base 1430 can be electrically coupled to a PCB at other locations (i.e., the top, the bottom, or a different one of the sides).

Base 1430 can include: (a) a leadframe 1439 with one or more electrically conductive leads 1431 and 1438; and (b) non-electrically conductive material 1432. MEMS device 1061 can be electrically coupled to leads 1431 and 1438 using wires 1062. Electrically conductive leads 1431 and 1438 are electrically coupled to electrically conductive leads 1016.

Electrically conductive lead 1438 can be configured to couple to a PCB 1499. In some examples, electrically conductive lead 1438 can include: (a) a lid coupling portion 1434 electrically configured to couple to one of electrically conductive leads 1016; (b) a mounting portion 1435 coupled to lid coupling portion 1434; and (c) base portion 1436 coupled to mounting portion 1435. In some examples, lid coupling portion 1434 and base portion 1436 are substantially perpendicular with mounting portion 1435. In other examples, lid coupling portion 1434 and base portion 1436 can be at other angles with mounting portion 1435.

At side 1479, mounting portion 1435 can include outer-connected lands or surface mount pads 1516, as illustrated in FIG. 15. Outer-connected lands or surface mount pads 1516 can be used to couple semiconductor package 1400 to PCB 1499 by, for example, by surface mount adhesive techniques (SMT), solder balls, or flip chip techniques. In some embodiments, outer-connected lands or surface mount pads 1516 are arranged in the pattern shown in FIG. 15. In other examples, outer-connected lands or surface mount pads 1516 can be arranged in a different pattern.

Non-electrically conductive material 1432 can be located around electrically conductive leads 1431 and 1438. In some examples, a first portion 1483 of non-electrically conductive material 1432 can have an aperture 1465. In other examples, semiconductor package 1400 can have additional apertures or apertures located other portions of lid 1010 or base 1430.

Figure 16:
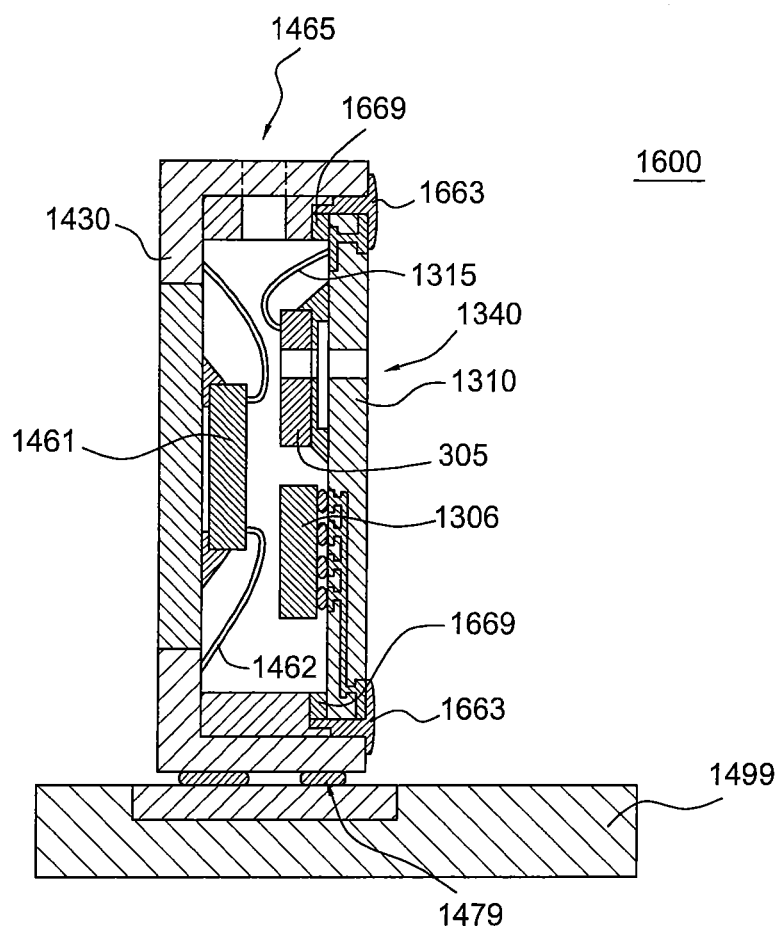
FIG. 16 illustrates a cross-sectional view of a semiconductor package (having the base of the semiconductor package of FIG. 14 and the lid of the semiconductor package of FIG. 13) coupled to a printed circuit board, according to a sixth embodiment.

Referring to yet another embodiment, FIG. 16 illustrates a cross-sectional view of a semiconductor package 1600, according to a sixth embodiment. Semiconductor package 1600 is merely exemplary and is not limited to the embodiments presented herein. Semiconductor package 1600 can be employed in many different embodiments or examples not specifically depicted or described herein.

In some embodiments, an air cavity packaging or semiconductor package 1600 can include: (a) a lid 1310; (b) a base 1430; (c) at least one MEMS device 305; (d) at least one electrical component 1306 and 1461; (e) wires 1462 and 1315 (f) non-electrically conductive adhesive 1669 mechanically coupling lid 1310 to base 1430; and (g) electrically conductive solder 1663 electrically and mechanically coupling lid 1310 to base 1430. In some embodiments, electrically conductive solder 1663 can be also used to couple semiconductor package 1600 to a PCB.

In the example illustrated in FIG. 16, semiconductor package 1600 is a vertically mounted package. That is, semiconductor package 1600 is coupled to PCB 1499 at side 1479 of base 1430. Semiconductor package 1600 can also be configured such that lid 1310 or base 1430 can be electrically coupled to a PCB at other locations (i.e., the top, the bottom, or a different one of the sides).

Figure 17:
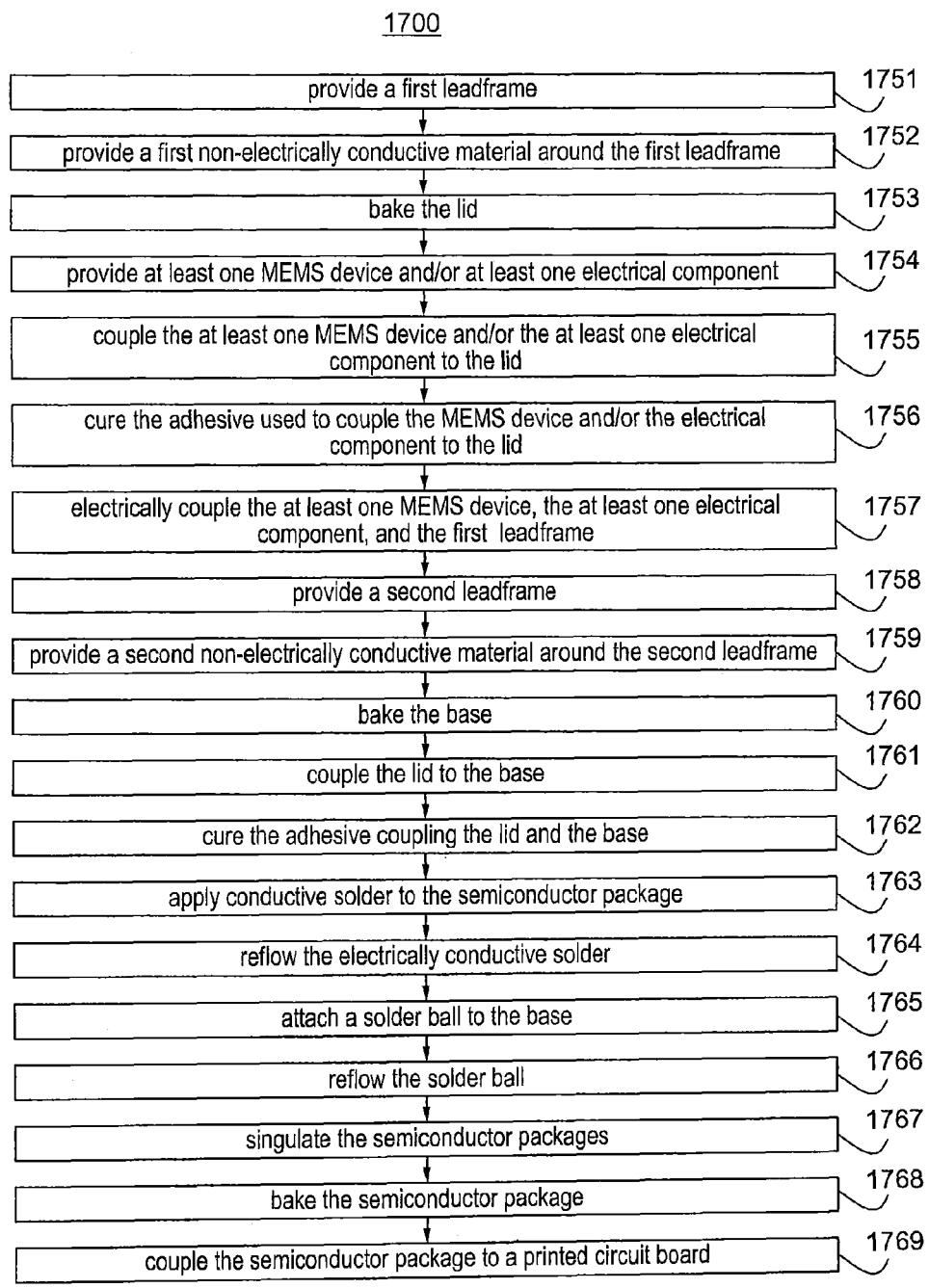
FIG. 17 illustrates a flow chart of an embodiment of a method of manufacturing a semiconductor package, according to an embodiment.

FIG. 17 illustrates a flow chart for an embodiment of a method 1700 of manufacturing a semiconductor package, according to an embodiment. Method 1700 is merely exemplary and is not limited to the embodiments presented herein. Method 1700 can be employed in many different embodiments or examples not specifically depicted or described herein. In some embodiments, the activities of the method 1700 can be performed in the order presented. In other embodiments, the activities of the method 1700 can be performed in any other suitable order. In still other embodiments, one or more of the activities described in method 1700 can be combined with another activity or skipped.

Referring to FIG. 17, method 1700 includes an activity 1751 of providing a first leadframe. The first leadframe can be formed by cutting, stamping, or etching sheet stock into a strip or array format. The sheet stock from which the first leadframe is formed can be an electrically conductive metal like copper or aluminum, although other metals or alloys can be used. In a different embodiment, the first lead frame can be formed by manufacturing a single or multi layered PCB. In some examples, the first leadframe can be similar or identical to leadframe 119 of FIG. 1, leadframe 919 of FIG. 9, leadframe 1019 of FIG. 10, and/or leadframe 1319 of FIG. 13.

Figure 18:
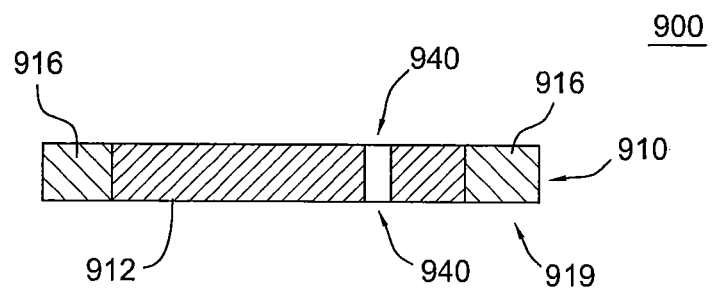
FIG. 18 illustrates a cross-sectional view of a semiconductor package after providing non-electrically conductive material around a first leadframe, according to the embodiment of FIG. 17.

Method 1700 continues with an activity 1752 of providing a non-electrically conductive material around the first leadframe to form a lid. FIG. 18 illustrates a cross-sectional view of semiconductor package 900 after providing non-electrically conductive material 912 around first leadframe 919 to form lid 910, according to this embodiment. First lead frame 910 has leads 916.

In some examples, non-electrically conductive material 912 can have an aperture 940. In other examples, non-electrically conductive material 912 can have additional apertures.

In various examples, the non-electrically conductive material can be similar or identical to non-electrically conductive material 112, 1012, and/or 1312 of FIGS. 1, 10 and 13, respectively. In some examples, the lid can be the same or similar to lid 110 of FIG. 1, lid 910 of FIG. 9, lid 1010 of FIG. 10, and/or lid 1310 of FIG. 13.

In some embodiments, providing a non-electrically conductive material around the first leadframe can include molding a plastic or organic material around the first leadframe. For example, a transfer or injection molding process can be used. In some embodiments, the non-electrically conductive material can be LCP plastic, PEEK plastic, ABS plastic, PCV plastic, PCB plastic, an epoxy resin, BT laminate, an organic laminate, or the equivalent.

Referring again to FIG. 17, method 1700 continues with an activity 1753 of baking the lid. For example, the lid illustrated in FIG. 18 can be baked for approximately 240 minutes at approximately 125° C. to remove moisture. Other baking processes can be used depending on the requirements of the final product.

In the same or different examples, activity 1753 can include cleaning the first leadframe. For example, leadframe 919 can be cleaned using a plasma cleaning process to remove oxides and other contaminants from surfaces of the first leadframe before or after proceeding with activity 1752.

Referring again to FIG. 17, method 1700 includes an activity 1754 of providing at least one MEMS device and/or at least one electrical component. In some examples, the at least one MEMS device and the at least one electrical component can be similar or identical to MEMS device 305 of FIG. 3, MEMS device 1061 in FIG. 10, electrical component 306 of FIG. 3, electrical component 1306 in FIG. 13, and/or electrical component 1461 of FIG. 14.

In other examples, activity 1754 can include providing two or more MEMS devices and only one electrical component. In further examples, activity 1754 can include providing two or more MEMS devices and two or more electrical components. In still other embodiments, activity 1754 does not include providing any electrical components and only one or more MEMS devices.

Figure 19:
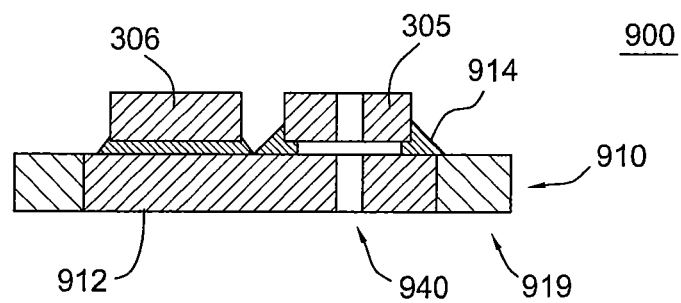
FIG. 19 illustrates a cross-sectional view of the semiconductor package of FIG. 18 after coupling a MEMS device and an electrical component to a lid, according to the embodiment of FIG. 17.

Method 1700 continues with an activity 1755 of coupling the at least one MEMS device and/or the at least one electrical component to the lid. FIG. 19 illustrates a cross-sectional view of semiconductor package 900 after coupling MEMS device 305 and electrical component 306 to lid 910, according to this embodiment. MEMS device 305 and electrical component 306 can be coupled to lid 910 using die attach material 314. In some examples, MEMS device 305 and electrical component 306 can be pick-and-placed onto lid 910. In the same or different examples, MEMS device 305 and electrical component 306 are coupled to base 130 using a die attach epoxy. In still other examples, MEMS device 305 and electrical component 306 can be coupled to lid 110 using surface mount adhesive techniques (SMT), solder balls, or flip chip techniques.

In the embodiment shown in FIGS. 9 and 19, one MEMS device and one electrical component are shown, but more than one MEMS device and none or more than one electrical component can be present.

Referring again to FIG. 17, method 1700 continues with an activity 1756 of curing the adhesive used to couple the MEMS device and/or the electrical component to the lid. In some examples, the adhesive applied in activity 1756 needs to be cured. For example, when epoxy is used, it can be cured for approximately 60 minutes at approximately 175 degrees ° C. In further examples, other curing profiles can be used to assure a complete curing of the adhesive. In still other embodiments, if the MEMS device and electrical component are coupled to the lid using a method that does not require curing, activity 1756 can be omitted.

In the same or different examples, activity 1756 can include cleaning the lid. For example, lid 910 can be cleaned using a plasma cleaning process to remove oxides and other contaminants from surfaces of the first leadframe before proceeding with activity 1761.

Figure 20:
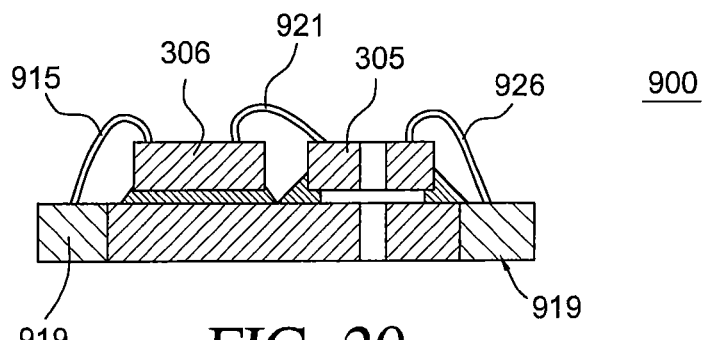
FIG. 20 illustrates a cross-sectional view of the semiconductor package of FIG. 18 after electrically coupling the MEMS device of FIG. 19, the electrical component of FIG. 19, and the first leadframe of FIG. 18, according to the embodiment of FIG. 17.

Method 1700 continues with an activity 1757 of electrically coupling the at least one MEMS device, the at least one electrical component, and the first leadframe. FIG. 20 illustrates a cross-sectional view of semiconductor package 100 after electrically coupling MEMS device 305, electrical component 306, and leadframe 919, according to this embodiment.

In the example illustrated in FIG. 20, MEMS device 305 is wire bonded to electrical component 306 using wire(s) 921. Electrical component 306 is wire bonded to leadframe 919 using wire(s) 915. MEMS device 305 is wire bonded to leadframe 919 using wire(s) 926. In other examples, other combinations of wire bonding can be used. In a different embodiment, wire bonding is not used and is replaced with solder balls, flip chip technologies, or the like.

Referring again to FIG. 17, method 1700 includes an activity 1758 of providing a second leadframe. The second leadframe can be formed by cutting, stamping or etching sheet stock into a strip or array format, and portions of the patterned sheet stock can be bent. The sheet stock from which the second leadframe is formed can be a conductive metal like copper or aluminum, although other metals or alloys can be used. In some examples, the second leadframe can be similar or identical to leadframe 139 of FIG. 1, leadframe 939 of FIG. 9, leadframe 1039 of FIG. 10, and/or leadframe 1439 of FIG. 14.

Figure 21:
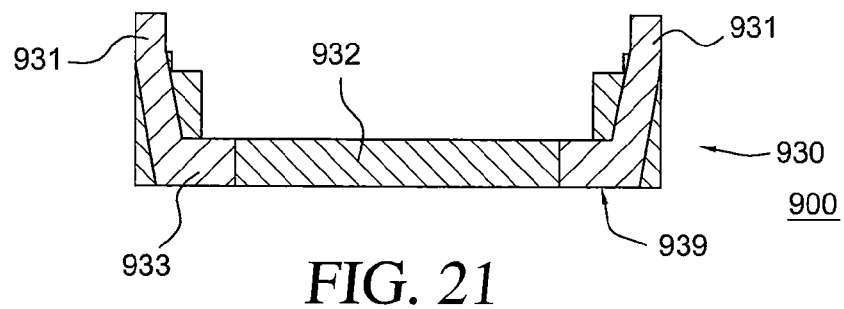
FIG. 21 illustrates a cross-sectional view of the semiconductor package of FIG. 18 after providing non-electrically conductive material around a second leadframe, according to the embodiment of FIG. 17.

Method 1700 continues with an activity 1759 of providing a second non-electrically conductive material around the second leadframe to form a base. FIG. 21 illustrates a cross-sectional view of semiconductor package 900 after providing non-electrically conductive material 932 around leadframe 939, according to this embodiment. In other examples, the non-electrically conductive material can be similar or identical to non-electrically conductive material 132, 1032, and/or 1432 of FIGS. 1, 10 and 14, respectively. In some examples, the base can be the same or similar to base 130 of FIG. 1, base 930 of FIG. 9, base 1030 of FIG. 10, and/or base 1430 of FIG. 14.

In some embodiments, providing a second non-electrically conductive material around the second leadframe can include molding a plastic or organic material around the second leadframe. For example, a transfer or injection molding process can be used. In some embodiments, the second non-electrically conductive material can be LCP plastic, PEEK plastic, ABS plastic, PCV plastic, PCB plastic, an epoxy resin, BT laminate, an organic laminate, or the equivalent.

Referring again to FIG. 17, method 1700 continues with an activity 1760 of baking the base. For example, the lid illustrated in FIG. 21 can be baked for approximately 240 minutes at approximately 125° C. to remove moisture. Other baking processes can be used depending on the requirements of the final product.

In the same or different examples, activity 1760 can include cleaning the base. For example, base 930 can be cleaned using a plasma cleaning process to remove oxides and other contaminants from surfaces of the first leadframe before or after proceeding with activity 1761.

In some examples, method 1700 can also include providing at least one MEMS device and/or at least one electrical component, mechanically coupling the at least one MEMS device and the at least one electrical component to the lid, and electrically coupling the at least one MEMS device, the at least one electrical component, and the second leadframe. This activity can occur after activity 1760 in FIG. 17.

In some examples, the at least one MEMS device and the at least one electrical component can be similar or identical to MEMS device 305 of FIG. 3, electrical component 306 of FIG. 3 and/or MEMS device 1061 of FIG. 14.

Figure 22:
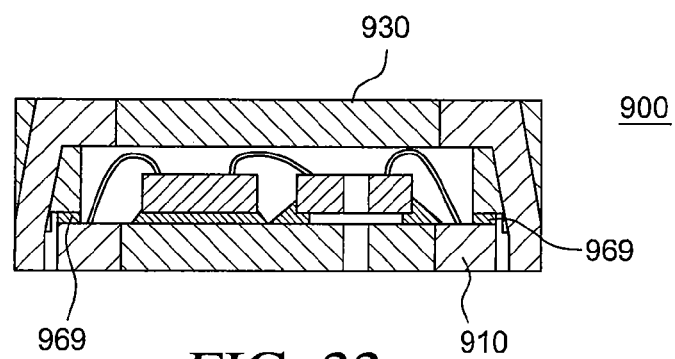
FIG. 22 illustrates a cross-sectional view of the semiconductor package of FIG. 18 after coupling the lid of FIG. 19 to the base of FIG. 21, according to the embodiment of FIG. 17.

Referring again to FIG. 17, method 1700 continues with an activity 1761 of coupling the lid to the base. As used herein, "coupling the lid to the base" refers to the procedure where the lid is coupled to the base and also refers to the procedure where the base is coupled to the lid. FIG. 22 illustrates a cross-sectional view of semiconductor package 900 after coupling lid 910 to base 930 using adhesive 969, according to this embodiment. Lid 910 can be coupled to base 930 using an electrically or non-electrically conductive adhesive.

Referring again to FIG. 17, method 1700 continues with an activity 1762 of curing the adhesive coupling the lid and the base. In some examples, the adhesive applied in activity 1760 needs to be cured. For example, when epoxy is used, it can be cured for approximately 60 minutes at approximately 175° C. In further examples, other curing profiles can be used to assure a complete curing of the adhesive. In still other embodiments, if the lid and the base are coupled using a method that does not require curing, activity 1762 can be omitted.

Method 1700 further comprises an activity 1763 of applying conductive solder to the semiconductor package, according to this embodiment. In some examples, a solder paste is applied to electrically couple the first leadframe to the second leadframe. In the same or different embodiment, the electrically conductive adhesive can also be used to electrically couple the semiconductor package to a PCB.

Figure 23:
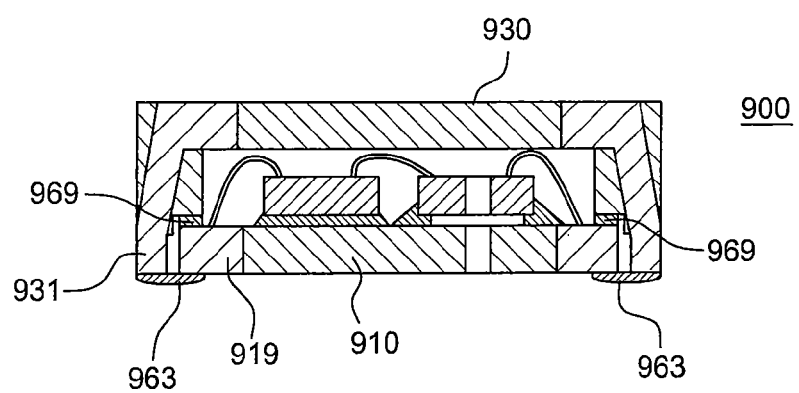
FIG. 23 illustrates a cross-sectional view of the semiconductor package of FIG. 18 after apply solder to the semiconductor package of FIG. 18, according to the embodiment of FIG. 17.

FIG. 23 illustrates a cross-sectional view of semiconductor package 900 after apply solder 963 to semiconductor package 900, according to this embodiment. In the example illustrated in FIG. 23, solder 963 is applied to leadframe 933 and leadframe 919.

Referring again to FIG. 17, method 1700 next includes an activity 1764 of reflowing the electrically conductive solder. In some examples, the solder paste applied in activity 1763 is heated to melt the solder and then cooled to permanently electrically couple the first leadframe to the second leadframe. For example, the solder can be heated to a peak reflow temperature of approximately 260° C. (e.g. ±5° C.) at with average ramp-up rate at 3° C. per sec from 200 deg to peak temperature.

Figure 24:
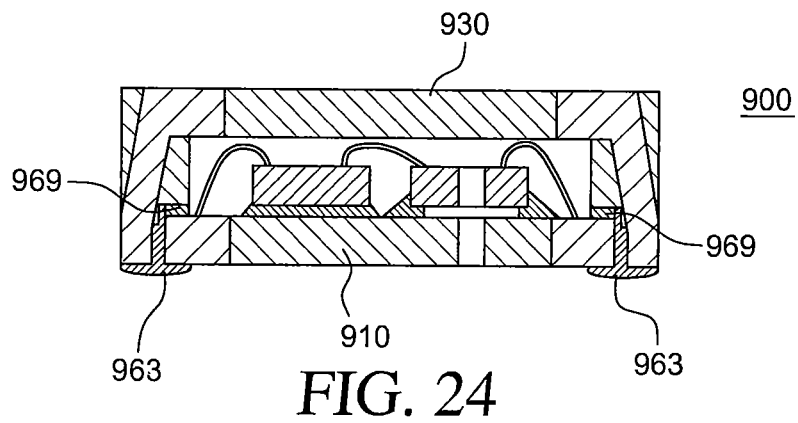
FIG. 24 illustrates a cross-sectional view of the semiconductor package of FIG. 18 after reflowing the solder of FIG. 23, according to the embodiment of FIG. 17.

FIG. 24 illustrates a cross-sectional view of semiconductor package 900 after reflowing solder 963, according to this embodiment. In the example illustrated in FIG. 24, solder 963 electrically couples leadframe 939 and leadframe 919.

In other examples, method 1700 does not include activities 1762 and 1763. Instead, in one example, an electrically conductive adhesive can be used to couple leadframe 933 to leadframe 919 as part of activity 1761.

Figure 25:
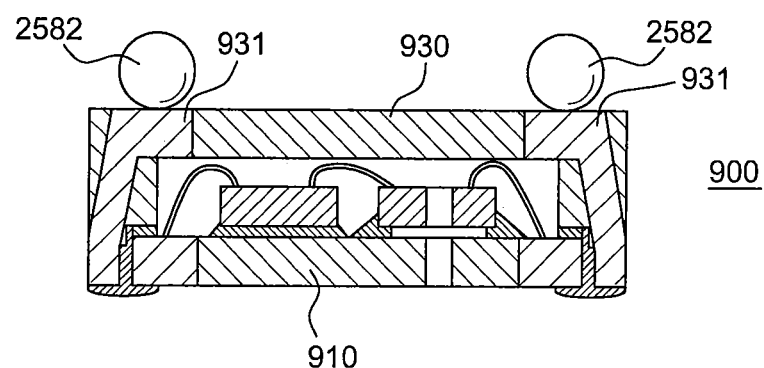
FIG. 25 illustrates a cross-sectional view of the semiconductor package of FIG. 18 after applying solder balls to the second leadframe of FIG. 21, according to the embodiment of FIG. 17.

Referring again to FIG. 17, method 1700 can also include an activity 1765 of attaching a solder ball to the base. In some examples, if the base will be attached to a PCB in activity 1766, method 1700 can include activity 1765 of attaching a solder ball to the base. FIG. 25 illustrates a cross-sectional view of semiconductor package 900 after apply solder balls 2582 to leadframe 933 of base 930, according to this embodiment.

Referring again to FIG. 17, method 1700 next includes an activity 1766 of reflowing the solder ball. In some examples, the solder balls applied in activity 1765 are heated to melt the solder and then cooled. For example, the solder can be heated to a peak reflow temperature of approximately 260° C. (e.g. ±5° C.) at with average ramp-up rate at 3° C. per sec from 200 deg to peak temperature.

Figure 26:
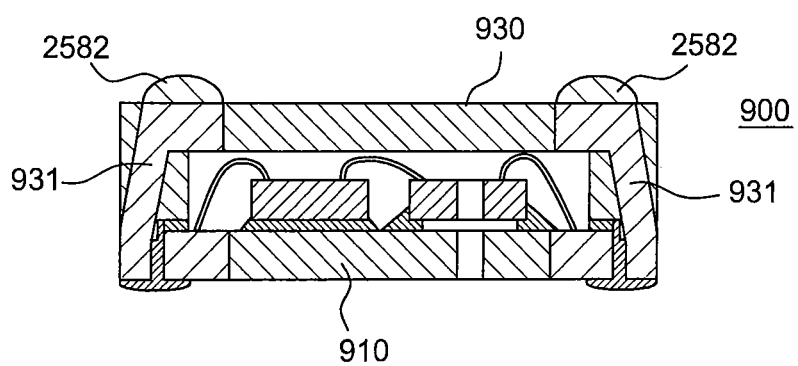
FIG. 26 illustrates a cross-sectional view of the semiconductor package of FIG. 18 after reflowing the solder balls of FIG. 25, according to the embodiment of FIG. 17.

FIG. 26 illustrates a cross-sectional view of semiconductor package 900 after reflowing solder balls 2582, according to this embodiment. In some examples, solder balls 2582 can be used to electrically couple semiconductor package 900 to a PCB during activity 1766.

In other examples, activities 1765 and 1766, or only activity 1766, can be skipped or performed later. For examples, if the semiconductor package is going to be coupled to a PCB at a side of the base or at the lid, activities 1765 and 1766 can be skipped.

Referring again to FIG. 17, method 1700 continues with an activity 1767 of singulating the semiconductor packages. In some examples, semiconductor package 900 is manufactured as a part of a set of two or more semiconductor packages. The two or more semiconductor packages are coupled together when the first leadframe is provided in activity 1751. In activity 1766, the leadframes of the two or more semiconductor devices are separated from one another. In some examples, the semiconductor packages can be singulated using a trim and saw method. In other examples, the semiconductor packages can be singulated using a punch and saw method. The singulation also can be performed after activities 1767 and/or 1768.

Method 1700 continues with an activity 1768 of baking the semiconductor package. For example, semiconductor package 900 can be baked for approximately 240 minutes at approximately 125° C. to remove moisture Other baking process can be used depending on the requirements of the final product.

Method 1700 can also include an activity 1769 of attaching the semiconductor package to a printed circuit board. In some examples, the top side of the base is coupled to a PCB. For example, FIGS. 10 and 13 illustrate an example where bottom 1038 of base 1030 of semiconductor package 1000 is coupled to PCB 1099. In other examples, the lid is coupled to a PCB. FIG. 11 illustrates an example where lid 1010 of semiconductor package 1000 is coupled to PCB 1199. In yet other examples, a side of the base is coupled to a PCB. FIG. 12 illustrates an example where a side 1067 of a base 1030 of semiconductor package 1000 is coupled to PCB 1299. FIGS. 14 and 16 illustrates an example where side 1479 of base 1430 of semiconductor packages 1400 and 1600, respectively, are coupled to PCB 1499.

In some examples, activities 1765-1769 can be similarly used to vertically attach a semiconductor package to a PCB. For examples, semiconductor packages 100 (FIG. 11) can be coupled to PCB 1299 using procedures similar or identical to one or more of activities 1765-1769. Furthermore, semiconductor packages 1400 and/or 1600 can be coupled to PCB 1499 using procedures similar or identical to one or more of activities 1765-1769.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that activity 1751-1769 of FIG. 3, or any element of FIG. 1-16 may be comprised of many different activities, procedures and be performed by many different modules, in many different orders and that the foregoing discussion of certain of these embodiments does not necessarily represent a complete description of all possible embodiments. All elements claimed in any particular claim are essential to the embodiment claimed in that particular claim. Consequently, replacement of one or more claimed elements constitutes reconstruction and not repair. Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A semiconductor package configured to electrically couple to a printed circuit board, the semiconductor package comprising:
   a lid comprising:
      one or more first electrically conductive leads;
   a base having a top, a bottom and one or more sides between the top and the bottom, the base comprising:
      one or more second electrically conductive leads electrically coupled to the one or more first electrically conductive leads;
   one or more first semiconductor devices mechanically coupled to the lid and electrically coupled to the one or more first electrically conductive leads; and
   one or more first micro-electrical-mechanical system devices mechanically coupled to the lid and electrically coupled to the one or more first electrically conductive leads,
   wherein:
      the lid is coupled to the base;
      at least one of the lid or the base has at least one port hole; and
      the one or more second electrically conductive leads are configured to couple to the printed circuit board at a first side of the one or more sides of the base.

2. The semiconductor package of claim 1, wherein:
   each of the one or more second electrically conductive leads comprise:
      a lid coupling portion configured to couple to one of the one or more first electrically conductive leads;
      a downset portion coupled to the lid coupling portion; and
      a pad portion coupled to the downset portion.

3. The semiconductor package of claim 2, wherein:
   the downset portion is configured to electrically and mechanically couple to the printed circuit board.

4. The semiconductor package of claim 2, wherein:
   the downset portion is at least partially located at the first side of the one or more sides of the base.

5. The semiconductor package of claim 2, wherein:
   the downset portion comprises one or more mounting pads.

6. The semiconductor package of claim 2, wherein:
   the downset portion is substantially perpendicular to the lid.

7. The semiconductor package of claim 2, further comprising:
   at least one first electrical device mechanically coupled to the base and electrically coupled to the pad portion,
   wherein:
      the at least one first electrical device comprises at least one of a second micro-electro-mechanical system device or a second semiconductor device.

8. The semiconductor package of claim 1, wherein:
   the at least one port hole is located at a second side of the one or more sides of the base.

9. The semiconductor package of claim 1, wherein:
   a first one of the at least one port hole is located at the base; and
   a second one of the at least one port hole is located at the lid.

10. The semiconductor package of claim 1, wherein:
    the lid further comprises:
       a non-electrically conductive material located around the one or more first electrically conductive leads.

11. The semiconductor package of claim 1, wherein:
    the base further comprises:
       a non-electrically conductive material located around the one or more second electrically conductive leads.

12. The semiconductor package of claim 1, further comprising:
    one or more second micro-electrical-mechanical system devices mechanically coupled to the base and electrically coupled to the one or more second electrically conductive leads.

13. The semiconductor package of claim 1, wherein:
    the one or more first semiconductor devices comprise an application specific integrated circuit, a passive semiconductor device, or a microphone.

14. An air cavity package configured to be coupled to a printed circuit board, the air cavity package comprising:
    a lid comprising:
       a first leadframe; and
       a first non-electrically conductive material coupled to the first leadframe;
    a base mechanically coupled to the lid, the base having a bottom and a first side substantially perpendicular to the bottom, the base comprising:
       a second leadframe electrically coupled to the first leadframe; and
       a second non-electrically conductive material coupled to the second leadframe;
    at least one first electrical device mechanically coupled to the lid and electrically coupled to the first leadframe; and
    at least one second electrical device mechanically coupled to the base and electrically coupled to the second leadframe,
    wherein:
       the at least one first electrical device comprises at least one of a first micro-electro-mechanical system device or a first semiconductor device;
       the at least one second electrical device comprises at least one of a second micro-electro-mechanical system device or a second semiconductor device;
       at least one of the lid or the base has at least one first aperture;
       the at least one first aperture provides a passageway from an interior of the air cavity package to an exterior of the air cavity package;
       the base is configured to be mechanically coupled to the printed circuit board at the first side; and
       the second leadframe is configured to be electrically coupled to the printed circuit board at the first side.

15. The air cavity package of claim 14, wherein:
    the second leadframe comprises one or more first electrical leads;
    each of the one or more first electrical leads comprise:

a first part substantially parallel to the lid; and
a second part substantially perpendicular to the lid; and
the first part is electrically coupled to the second part.

16. The air cavity package of claim 14, wherein:
the second leadframe comprises one or more mounting pads; and
the one or more mounting pads are configured to couple to the printed circuit board.

17. The air cavity package of claim 16, further comprising:
one or more solder balls coupled to the one or more mounting pads of the second leadframe.

18. The air cavity package of claim 14, wherein:
the first non-electrically conductive material has a second aperture; and
the at least one first aperture comprises the second aperture.

19. A method of providing a semiconductor package, the method comprising:
providing a first leadframe;
providing a first non-electrically conductive material around the first leadframe to form a lid;
providing at least one micro-electrical-mechanical system device and at least one electrical component;
coupling the at least one micro-electrical-mechanical system device and the at least one electrical component to the lid;
electrically coupling the at least one micro-electrical-mechanical system device, the at least one electrical component, and the first leadframe;
providing a second leadframe;
providing a second non-electrically conductive material around the second leadframe to form a base, the base having a top, a bottom, and one or more sides between the top and the bottom;
coupling the lid to the base; and
coupling the base of the semiconductor package to a printed circuit board such that the second leadframe is electrically coupled to the printed circuit board at a first side of the one or more sides of the base.

20. The method of claim 19, wherein:
the first side of the one or more sides of the base is substantially perpendicular to the lid after coupling the lid to the base.

21. The method of claim 19, wherein:
providing the second leadframe comprises:
providing the second leadframe with the one or more sides substantially perpendicular to the bottom.

22. The method of claim 19, wherein:
providing the second leadframe comprises:
providing a first electrically conductive lead comprising:
a lid coupling portion configured to couple to the first leadframe;
a downset portion coupled to the lid coupling portion; and
a pad portion coupled to the downset portion.

23. The method of claim 22, wherein:
coupling the base of the semiconductor package to the printed circuit board comprises:
coupling the downset portion to the printed circuit board.

24. The method of claim 19, further comprising:
applying solder to the lid and the base; and
reflowing the solder to electrically couple the lid to the base.

* * * * *